US006085655A

United States Patent [19]

Harris et al.

[11] Patent Number: 6,085,655

[45] **Date of Patent: *Jul. 11, 2000**

[54] DIRECT WRITE WATERLESS IMAGING MEMBER WITH IMPROVED ABLATION PROPERTIES AND METHODS OF IMAGING AND PRINTING

[75] Inventors: Mark A. Harris, Rochester; David B. Bailey, Webster, both of N.Y.

[73] Assignee: Kodak Polychrome Graphics LLC, Norwalk, Conn.

[ * ] Notice: This patent is subject to a terminal disclaimer.

[21] Appl. No.: 09/365,127

[22] Filed: Jul. 30, 1999

Related U.S. Application Data

[62] Division of application No. 09/015,723, Jan. 29, 1998, Pat. No. 5,950,542.

[51] Int. Cl.$^{7}$ .............................. B41N 1/14; G03F 7/075

[52] U.S. Cl. .......................... 101/456; 101/457; 101/467; 430/303

[58] Field of Search .................................... 101/455, 456, 101/457, 462, 463.1, 465, 466, 467; 430/303

[56] References Cited

U.S. PATENT DOCUMENTS

| | | | |
|---|---|---|---|
| 4,064,312 | 12/1977 | Crystal | 101/457 |
| 4,096,294 | 6/1978 | Pacansky | 427/197 |
| 4,430,379 | 2/1984 | Hayakawa et al. | 101/457 |
| 4,718,340 | 1/1988 | Love, III | 101/467 |
| 4,755,445 | 7/1988 | Hasegawa | 430/138 |
| 5,339,737 | 8/1994 | Lewis et al. | 101/454 |
| 5,351,617 | 10/1994 | Williams | 101/467 |
| 5,353,705 | 10/1994 | Lewis et al. | 101/453 |
| 5,379,698 | 1/1995 | Nowalk et al. | 101/454 |
| 5,385,092 | 1/1995 | Lewis et al. | 101/467 |
| 5,417,164 | 5/1995 | Nishida et al. | 101/453 |
| 5,786,125 | 7/1998 | Tsuchiya et al. | 430/303 |
| 5,950,542 | 9/1999 | Harris et al. | 101/457 |

FOREIGN PATENT DOCUMENTS

| | | | |
|---|---|---|---|
| 1050805 | 3/1979 | Canada | 101/467 |
| 59-051164 | 5/1984 | Japan . | |
| 60-196347 | 10/1985 | Japan . | |
| 9207716 | 5/1992 | WIPO . | |
| 9418005 | 8/1994 | WIPO . | |
| 9821037 | 5/1998 | WIPO . | |

*Primary Examiner*—Stephen R. Funk
*Attorney, Agent, or Firm*—Ratner & Prestia

[57] ABSTRACT

A lithographic imaging member, such as a printing plate, has a support having thereon an ink-accepting melanophilic layer and an ink-rejecting siloxane surface melanophobic layer. Within the printing plate is a photothermal conversion material capable of converting irradiation, such as IR radiation, to heat in exposed regions. Also within one of the layers is a compound that upon imaging releases a moiety that facilitates degradation of the surface melanophobic layer. The released moiety can be fluoride ion or a fluoride ion-containing compound. In some imaging members, a barrier layer may be interposed between the two other layers. Such imaging members can be digitally imaged and used for printing without post-imaging processing.

32 Claims, 1 Drawing Sheet

DIRECT WRITE WATERLESS IMAGING MEMBER WITH IMPROVED ABLATION PROPERTIES AND METHODS OF IMAGING AND PRINTING

CROSS-REFERENCE TO RELATED APPLICATIONS

This application is a divisional of Ser. No. 09/015,723, filed Jan. 29, 1998, now U.S. Pat. No. 5,950,542.

FIELD OF THE INVENTION

This invention relates in general to lithographic imaging members, and particularly to waterless lithographic printing plates that require no processing after imaging. The invention also relates to a method of digital imaging such imaging members, and to a method of using them for printing.

BACKGROUND OF THE INVENTION

Very common lithographic printing plates include a metal or polymer support having thereon an imaging layer sensitive to visible or UV light. Both positive- and negative-working printing plates can be prepared in this fashion. Upon exposure, and perhaps post-exposure heating, either imaged or non-imaged areas are removed using wet processing chemistries.

Thermally sensitive printing plates are less common. One such plate is available from Eastman Kodak Company as the KODAK Direct Image Thermal Printing Plate. It includes an imaging layer comprising a mixture of dissolvable polymers and an infrared radiation absorbing compound. While these plates can be imaged using lasers and digital information, they require wet processing using alkaline developer solutions.

Dry planography, or waterless printing, is well known in the art of lithographic offset printing and provides several advantages over conventional offset printing. Dry planography is particularly advantageous for short run and on-press applications. It simplifies press design by eliminating the fountain solution and aqueous delivery train. Careful ink water balance is unnecessary, thus reducing rollup time and material waste. Silicone rubbers, [such as poly (dimethylsiloxane) and other derivatives of poly(siloxanes)] have long been recognized as preferred waterless-ink repelling materials. The criteria for waterless lithography and the ink repelling properties of poly(siloxanes) have been extensively reviewed in the TAGA Proceedings 1975 pages 120, 177 and 195 and 1976 page 174. In addition to low surface energy, it was concluded that the ability to swell in long-chain alkane ink solvents (i.e., its "oleophilic" nature) accounts for silicone's superior ink releasing characteristics. An important consideration is that siloxane polymers repel ink.

In the lithographic art, materials that release or repel oil based inks are usually referred to as having "oleophobic" character. Herein, ink repelling materials are defined as "melanophobic" and, conversely, the term "melanophilic" is used to describe ink "loving" or accepting materials.

The basic method of preparing a waterless printing plate involves the imagewise removal of silicone to expose an underlying ink accepting surface. For example, U.S. Pat. No. 3,677,178 (Gipe) discloses a waterless lithographic offset printing plate having a flexible substrate overcoated with a diazo layer that was in turn overcoated with silicone rubber. The plate was exposed to actinic radiation through a mask, initiating a reaction in the diazo layer that rendered the exposed areas insoluble. Development was accomplished by swabbing with a cotton pad containing water and a wetting agent to remove the unexposed coating areas.

It was recognized thereafter that a lithographic printing plate could be created containing an IR absorbing layer. Canadian Patent 1,050,805 (Eames) discloses a dry planographic printing plate comprising an ink receptive substrate, an overlying silicone rubber layer, and an interposed layer comprised of laser energy absorbing particles (such as carbon particles) in a self-oxidizing binder (such as nitrocellulose) and an optional cross-linkable resin. Such plates were exposed to focused near IR radiation with a $Nd^{++}YAG$ laser. The absorbing layer converted the infrared energy to heat thus partially loosening, vaporizing, or ablating the absorber layer and the overlying silicone rubber. The plate was developed by applying naphtha solvent to remove debris from the exposed image areas. Similar plates are described in *Research Disclosure* 19201, 1980 as having vacuum-evaporated metal layers to absorb laser radiation in order to facilitate the removal of a silicone rubber overcoated layer. These plates were developed by wetting with hexane and rubbing. $CO_2$ lasers are described for ablation of silicone layers by Nechiporenko & Markova, PrePrint 15th International IARIGAI Conference, June 1979, Lillehammer, Norway, Pira Abstract 02-79-02834.

More recently, WO 94/18005 discloses the use of dry cotton pads or non-solvent wiping to develop dry planographic plates after laser imaging.

Direct digital imaging on-press or a platesetter is also well known. In this case, the printing plates having various layered structures wherein the layers having different affinities for ink and printing liquids are exposed to ablative absorption on press to create a printable lithographic surface in response to digital information supplied to a laser imaging apparatus. See, for example, U.S. Pat. No. 4,718,340 (Love III), WO 92/07716 (Landsman), U.S. Pat. No. 5,379,698 (Nowak et al), U.S. Pat. No. 5,339,737 (Lewis et al), U.S. Pat. No. 5,385,092 (Lewis et al), U.S. Pat. No. 5,351,617 (Williams) and U.S. Pat. No. 5,353,705 (Lewis et al). In using these technologies, removal of the silicone rubber after exposure requires a development step that includes wiping.

Due to the toughness and thermal stability of crosslinked silicone polymers, printing plates containing same are limited in their reproducibility of the images when laser ablation of the polymers is used for imaging. The problem arises from the conflicting need to have wear resistant silicone polymer layers for long press runs while maintaining ease of layer removal by laser ablation. Crosslinking makes complete removal more difficult, and silicone polymer debris clings to the underlying layers, and must be physically wiped off, as noted above. Wiping presents several disadvantages, including the difficulty of reproducibly removing all debris, and the susceptibility of the printing plate surface to scratching during wiping or other mechanical cleaning operations.

The need to change the nature of silicone layers has been recognized. For example, U.S. Pat. No. 4,755,445 (Hasegawa) describes the use of photohardenable microcapsules in a "waterless" printing plate. After imaging, unexposed microcapsules are broken, releasing an ink-receptive compound onto the silicone surface. This approach suffers from the need for a second UV exposure or heating step to complete the plate image, and is not suitable for direct digital imaging.

JP Kokai 60-196347 (Toray industries) describes "painting" a silicone plate surface with ammonium fluoride to etch away the silicone surface, followed by washing. The ammonium fluoride can also be applied in a polymeric dispersion using various techniques. Subsequent heat treatment adhered the polymer to the silicone surface. This imaging system and method are cumbersome and complicated, and make it difficult to produce fine details on a printing plate.

There is a need for processless, digitally imageable printing plates, that have high writing sensitivity (requiring low laser energy for imaging), excellent image quality, and long run length. Such imaging members must have a tough surface silicone layer, but must be easily imaged with minimal debris in background areas without wiping or any other mechanical cleaning process.

SUMMARY OF THE INVENTION

The problems noted above are overcome using an imaging member comprising:

- a melanophilic layer comprising a polymeric matrix capable of accepting ink, and
- a surface melanophobic layer comprising a siloxane polymer, and
- the imaging member further comprising a photothermal conversion material, and a compound that upon imaging, releases a moiety that facilitates degradation of the surface melanophobic layer.

This invention also provides a method of imaging comprising the steps of:

A) providing the imaging member described above, and

B) imagewise ablating the surface melanophobic layer of the imaging member using infrared radiation to provide a surface image on the imaging member.

Further, this invention provides a method of printing comprising steps A and B noted above, followed by C) inking the surface image and imagewise transferring the ink to a receiving material.

The imaging members of this invention are directly imageable using digital information supplied to a laser. They have high writing sensitivity, high image quality, short roll up and long run length. They provide a means for direct digital imaging and printing without the need for wet processing, wiping or other mechanical cleaning procedures to remove ablated material. The silicone surface layer is extremely tough, providing wearability, but ablation thereof is facilitated by the release of fluoride ion (preferably, thermal release), or another moiety that, for example, aids in degradation of the —Si—O— bonds in the silicone polymer in the surface melanophobic layer. As a result, the irradiation exposure needed for "clean" ablation and good image discrimination is lessened.

DETAILED DESCRIPTION OF THE INVENTION

Figure 1:
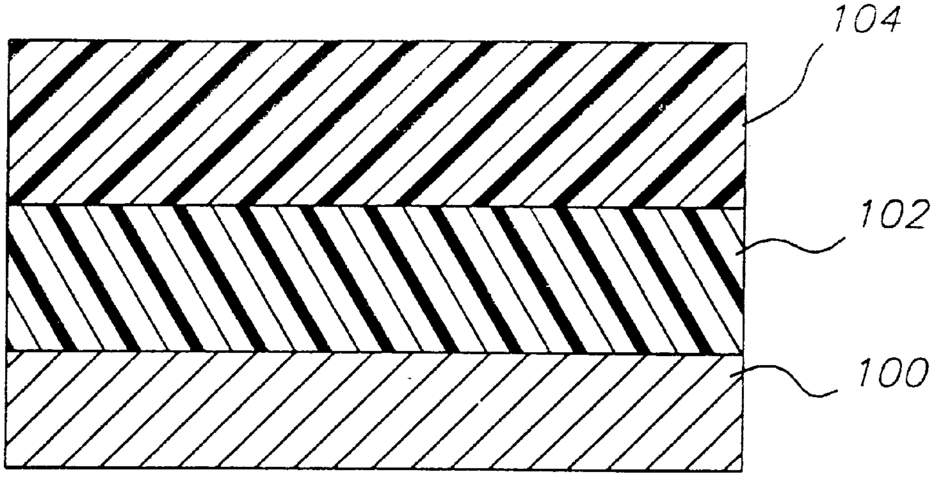
FIG. 1 is a highly schematic, cross-sectional view of one embodiment of the invention having a support and two supported layers.
Figure 2:
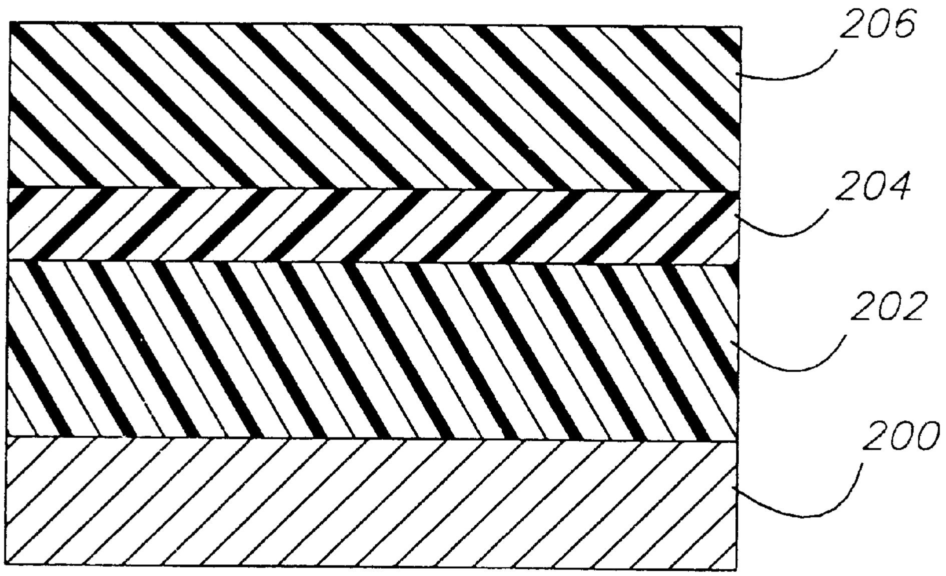
FIG. 2 is a highly schematic, cross-sectional view of a preferred embodiment of this invention having a support and three supported layers, one being a barrier layer.

A representative imaging member of this invention is illustrated in FIG. 1, as having support 100 having thereon melanophilic layer 102 and surface melanophobic layer 104. FIG. 2 shows another embodiment of this invention as having support 200 having thereon melanophilic layer 202, barrier layer 204 and surface melanophobic layer 206. Further details of such layers components for these and other embodiments are provided below.

A support can be used in the imaging member, and can be any self supporting material including polymeric films, glass, ceramics, metals or stiff papers, or a lamination of any of these materials. The thickness of the support can be varied. In most applications, the thickness should be sufficient to sustain the wear from printing and thin enough to wrap around a printing form. A preferred embodiment uses a polyester support prepared from, for example, polyethylene terephthalate or polyethylene naphthalate, and having a thickness of from about 100 to about 310 $\mu$m. Another preferred embodiment uses aluminum foil having a thickness of from about 100 to about 600 $\mu$m. The support should resist dimensional change under conditions of use so the color records will register in a full color image.

In another embodiment, the support can also act as the melanophilic layer, especially when the moiety-releasing compound (described below) is located in the melanophobic layer (for example, in encapsulated form).

A support may be coated with one or more "subbing" layers to improve adhesion of the final assemblage. Examples of subbing layer materials include, but are not limited to, adhesion promoting materials such as alkoxysilanes, aminopropyltriethoxysilane, glycidoxypropyltriethoxysilane and epoxy functional polymers, as well as conventional subbing layer materials used on polyester supports in photographic films. One or more IR radiation reflecting layers, such as layers of evaporated metals, can also be incorporated between the melanophilic layer and the support In addition, an anti-IR radiation reflection layer can be incorporated on the radiation-receiving side of the melanophilic layer.

The back side of the support may be coated with antistatic agents and/or slipping layers or matte layers to improve handling and "feel" of the imaging member plate. There may be a protective overcoat on either side of the support, as long as the protective overcoat on the "imaging" side is readily ablated along with the melanophilic layer.

The imaging member comprises at least two coextensive layers. By "coextensive" is meant that they cover essentially the same area of the support The coextensive melanophilic layer is nearest the support The surface melanophobic layer is located above the melanophilic layer, and may be contiguous, or adjacent, thereto. Preferably, the two layers are separated by a barrier layer. The imaging member can include multiple melanophilic or melanophobic layers as long as there is an outermost surface melanophobic layer.

The melanophilic layer(s) of the imaging member are generally composed of one or more organic or inorganic polymeric materials that accept ink. Useful organic polymeric materials include, but are not limited to, polycarbonates, polyesters, polyurethanes, polystyrenes, and polyacrylates (including polymethacrylates and polycyanoacrylates). Chemically modified cellulose derivatives are particularly useful, such as nitrocellulose, cellulose acetate propionate and cellulose acetate, as described in U.S. Pat. No. 4,695,286 (Vanier et al), U.S. Pat. No. 4,775,657 (Harrison et al) and U.S. Pat. No. 4,962,081 (Harrison et al), all incorporated herein by reference. Nitrocellulose is most preferred.

Preferred inorganic melanophilic layer matrices are those that are crosslinkable. Many crosslinking materials are known, and those derived from di-, tri or tetralkoxy silanes or titanates, borates, zirconates and aluminates are particularly useful.

This layer can also include conventional surfactants for coatability, inks or colorants for improved visualization, and other addenda commonly incorporated into such materials. Particularly useful surfactants for such polymeric layers are DC 510, a silicone oil commercially available from Dow Corning Company (Midland, Mich.), ZONYL® FSN surfactant, available from DuPont, and FC431, a surfactant available from 3M company. These surfactants can also be used in the melanophobic layer.

The melanophilic layer generally has a dry thickness of at least 0.01 and preferably at least 1 μm, and generally less than 20 and preferably less than 10 μm.

The melanophobic layer is composed of one or more siloxane rubber polymers or copolymers comprising a crosslinked or uncrosslinked polyalkylsiloxane (such as polymethylsiloxane, derivatives of polyalkylsiloxanes, polyalkylsiloxanes with functional alkoxide groups pendant or at terminal sites, or copolymers thereof). The preferred embodiments are the crosslinked polydimethylsiloxane rubbers. Crosslinking can be accomplished using techniques well known in the art, including alkoxy silane condensation and hydrosilylation of vinyl-substituted siloxanes.

Details of some useful silicone copolymers for the melanophobic layer are provided in U.S. Ser. No. 08/749,050, incorporated herein by reference, now abandoned in favor of continuation-in-part U.S. Ser. No. 09/208,520, allowed Nov. 10, 1999, now U.S. Pat. No. 6,040,115.

This layer can also include one or more of conventional surfactants for coatability or other properties, or dyes or colorants to allow visualization of the written image, or any other addenda commonly used in the lithographic art, as long as the concentrations are low enough so that there is no significant interference with the ability of the desired properties of the melanophobic layer. Useful surfactants are described above.

The dry thickness of the one or more melanophobic layers is generally at least 0.1 and preferably at least 1 μm. Generally, the thickness is less than 20 and preferably less than 5 μm.

In either or both of the melanophobic and melanophilic layers of the imaging member, are one or more non-luminescent photothermal conversion materials to absorb appropriate radiation from an appropriate irradiation source, such as a laser, which radiation is converted into heat. Thus, such materials convert photons into heat phonons. Preferably, the radiation absorbed is in the infrared and near-infrared regions of the electromagnetic spectrum. Such materials can be dyes, pigments, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family but lacking the $WO_{2.9}$ component, are also useful. One particularly useful pigment is carbon of some form (for example, carbon black). The size of the pigment particles should not be more than the thickness of the layer. Preferably, the size of the particles will be half the thickness of the layer or less.

Useful absorbing dyes for near infrared diode laser beams are described, for example, in U.S. Pat. No. 4,973,572 (DeBoer), incorporated herein by reference. Particular dyes of interest are "broad band" dyes, that is those that absorb over a wide band of the spectrum. In one embodiment of the invention, the photothermal conversion material is a dye such as 2-[2-{2-chloro-3-[(1,3-dihydro- 1,1,3-trimethyl-2H-benz[e]indol-2-ylidene)ethylidene]-1-cyclohexe-1-yl}ethenyl]- 1,1,3-trimethyl-1H-benz[e]indolium salt of 4-methylbenzenesulfonic acid, or tetrachlorophthalocyanine aluminum chloride. Mixtures of pigments, dyes, or both, can also be used.

Preferably, the photothermal conversion materials are located in at least the melanophilic layer of the printing plate, but in whichever layer(s) they are located, they must not interfere with the function and properties of that layer.

Wherever the photothermal conversion materials are located, they are generally present in an amount sufficient to provide an optical density of at least 0.5, and preferably at least 1.0. The particular amount needed for this purpose would be readily apparent to one skilled in the art, depending upon the specific material used.

In addition, either or both of the melanophobic and melanophilic layers contain one or more compounds that upon heating, such as during imaging, release a moiety that facilitates degradation of the surface melanophobic layer. These released moieties facilitate the breakdown of this layer, for example, by breaking the —Si—O— bonds in the siloxane polymer of that layer.

There are a variety of such moiety-releasing compounds that can be used in the practice of this invention in this manner, including those that contain, transfer or chemically release, upon imaging (e.g. heating), a fluoride ion-containing compound that, presumably, will attack the —Si—O— bonds or other sites in the melanophobic layer. A preferred material of this type is a compound that releases fluoride ion, such as a tetraalkylammonium fluoride (including tetrabutylammonium fluoride, tetraisopropylammonium fluoride, tetrahexylammonium fluoride) and other fluoride salts. Tetrabutylammonium fluoride is most preferred. Another useful fluoride ion-containing compound is Compound B:

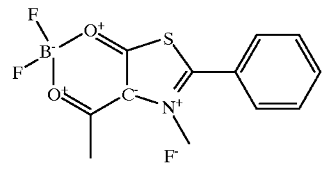

While the moiety-releasing compounds defined above can be located in any of the layers of the imaging member, preferably they are "isolated" from the surface melanophobic layer in some manner. Thus, they can be located in an underlying layer, or they can be located within the surface melanophobic layer if they are encapsulated. For example, microcapsules could enclose either or both the moiety-releasing compound as well as a photothermal conversion material (defined above).

Preferably, the imaging member includes a "barrier" layer between the surface melanophobic layer and a lower melanophilic layer. This barrier layer can contain the moiety-releasing compound described above, and can be composed of the same or similar polymers used in the melanophilic layer, such as polyesters, polyurethanes, polystyrenes, polycarbonates, polyacrylates (including polycyanoacrylates and polymethacrylates), and others described hereinabove. Latex polymer dispersions can also be coated to form barrier layers. A preferred barrier layer polymer is a polyurethane.

The barrier layer can also include adhesion promoting materials such as alkyl-silane adhesion promoters such as glycidoxypropyl triethoxy silane, aminopropyl triethoxysilane and alkoxy titanates such as tetraisopropoxytitanate. The layer can also include a photothermal conversion material as described above.

The layers of the printing plate are coated onto the support using any suitable equipment and procedure, such as spin coating, knife coating, gravure coating, dip coating or extrusion hopper coating.

The imaging members of this invention can be of any useful form including, but not limited to, printing plates, printing cylinders, printing sleeves, and printing tapes (including flexible printing webs).

Printing plates can be of any useful size and shape (for example, square or rectangular) having the requisite layers disposed on a suitable metal or polymeric substrate. Printing cylinders and sleeves are rotary printing members having the support and requisite layers in a cylindrical form. Hollow or solid metal cores can be used as substrates for printing sleeves.

During use, the imaging member of this invention is exposed to a focused laser beam to create the printed image, typically from digital information supplied to the imaging device. No wet processing, or mechanical or solvent cleaning is needed before the printing operation. A cleaning dust collector may be useful during the laser exposure step to keep the focusing lens clean. Such a collector is described in U.S. Pat. No. 5,574,493 (Sanger et al). The laser used to expose the imaging member of this invention is preferably a diode laser, because of the reliability and low maintenance of diode laser systems, but other lasers such as gas or solid state lasers may also be used. The combination of power, intensity and exposure time for laser imaging would be readily apparent to one skilled in the art for them to be sufficient to create the image. Specifications for lasers that emit in the near-IR region, and suitable imaging configurations and devices are described in U.S. Pat. No. 5,339,737 (Lewis et al), incorporated herein by reference. The laser typically emits in the region of maximum responsiveness in the imaging member, that is where the $\lambda_{max}$ closely approximates the wavelength where the imaging member absorbs most strongly.

The imaging apparatus can operate on its own, functioning solely as a platemaker, or it can be incorporated directly into a lithographic printing press. In the latter case, printing may commence immediately after imaging, thereby reducing press set-up time considerably. The imaging apparatus can be configured as a flatbed recorder or as a drum recorder, with the imaging member mounted to the interior or exterior cylindrical surface of the drum.

In the drum configuration, the requisite relative motion between the laser beam and the imaging member can be achieved by rotating the drum (and the imaging member mounted thereon) about its axis, and moving the laser beam parallel to the rotation axis, thereby scanning the imaging member circumferentially so the image "grows" in the axial direction. Alternatively, the beam can be moved parallel to the drum axis and, after each pass across the imaging member, increment angularly so that the image "grows" circumferentially. In both cases, after a complete scan by the laser beam, an image corresponding (positively or negatively) to the original document or picture can be applied to the surface of the imaging member.

In the flatbed configuration, the laser beam is drawn across either axis of the imaging member, and is indexed along the other axis after each pass. Obviously, the requisite relative motion can be produced by moving the imaging member rather than the laser beam.

Regardless of the manner in which the laser beam is scanned, it is generally preferable (for on-press uses) to employ a plurality of lasers and to guide their outputs to a single writing array. This array is then indexed, after completion of each pass across or along the imaging member, a distance determined by the number of beams emanating from the array, and by the desired resolution (that is, the number of image points per unit length). Off-press applications, which can be designed to accommodate very rapid plate movement and thereby utilize high laser pulse rates, can frequently utilize a single laser as an imaging source.

It may be desirable to preheat the imaging member to facilitate release of the moiety that facilitates degradation of the siloxane polymer prior to imaging. Preheating can be accomplished in any suitable manner including the use of laser imaging (for example, using an additional imagewise laser exposure). It would be most efficient to use a separate preheat laser prior to imagewise exposure of the imaging member with an imaging laser. Alternatively, a blanket heating step could be interposed between the two laser exposure steps. Imagewise preheating is preferred before the imagewise ablation step.

Once the imaging member has been imaged, printing can then be carried out by applying a lithographic ink to the image on its surface, with or without a fountain solution, and then transferring the ink to a suitable receiving material (such as cloth, paper, metal, glass or plastic) to provide a desired impression of the image thereon. The imaging member can be cleaned between impressions, if desired, using conventional cleaning means.

The following examples illustrate the practice of the invention, and are not meant to limit it in any way.

EXAMPLE 1

A nitrocellulose dispersion was prepared by ball milling nitrocellulose and carbon (Black Pearls 450 from Cabot) in a 90/10 blend of butyl acetate and isopropyl alcohol. The resulting dispersion contained 16.8% (weight) nitrocellulose and 10% (weight) carbon black.

A polyethylene terephthalate support (100 $\mu$m) was coated with the nitrocellulose dispersion noted above to form a melanophilic layer (1.08 g/m$^2$ nitrocellulose and 0.65 g/m$^2$ of carbon black), using a coating knife.

In the printing plates of this invention (E-1 to E-4), the melanophilic layer included tetrabutylammonium fluoride (5, 10, 15 or 20 weight % of the nitrocellulose coverage), as the fluoride ion releasing compound (TBAF). The amount of solvent was adjusted to keep the dried nitrocellulose coverage constant. The tetrabutylammonium fluoride was obtained as a 1 molar solution in tetrahydrofuran from Aldrich Chemical Company. The Control C-1 plate contained no TBAF.

An outer surface melanophobic layer was coated on all of the printing plates to have 1.61 g/m$^2$ of PS 448, a vinyldimethyl terminated poly(dimethylsiloxane) (United Chemical Technologies), 0.061 g/m$^2$ of PS 120, a poly (hydromethylsiloxane) (United Chemical Technologies), 0.016 g/m$^2$ of SIT-7900 a1,3,5,7-tetravinyl-1,3,5,7-tetramethylcyclotetrasiloxane (Gelest, Inc.), and 0.0098 g/m$^2$ of SIP 6831.1, a platinum-divinyltetramethyldisiloxane solution (Gelest, Inc.) from dichloromethane.

Each printing plate was cured in an oven at 100° C. for 10 minutes before imaging. The printing plates were imaged as described above and used for printing on a commercially available Heidelberg GTO 52 press with temperature control. A waterless ink, K50-95932-Black (INX International, Rochester, N.Y.), was used for the printing. Reflection densities of the printed sheets, i.e. Dmin (uninked paper density), Dmax (solid area), 80% and 50% halftone areas, were measured after 50 impressions. TABLE I shows the various printing plates prepared and tested and the results.

TABLE I

| PRINTING PLATE | % TBAF | Dmin | DENSITY AT 50% HALFTONE | DENSITY AT 80% HALFTONE | Dmax (100%) |
|---|---|---|---|---|---|
| Control C-1 | 0 | 0.05 | 0.10 | 0.67 | 1.5 |
| E-1 | 5 | 0.05 | 0.08 | 0.76 | 1.4 |
| E-2 | 10 | 0.05 | 0.07 | 0.87 | 1.4 |
| E-3 | 15 | 0.05 | 1.4 | 1.5 | 1.5 |
| E-4 | 20 | 0.05 | 0.5 | 1.5 | 1.5 |

The data in TABLE I show that the addition of the TBAF, in increasing amounts, to the melanophilic layer, improved the half-tone dot range. There was no effect on the, ink-repelling property of the non-image areas.

EXAMPLE 2

Additional printing plates were prepared as described in Example 1, except that a "barrier" layer composed of Estane 5755 polyurethane (0.27 $g/m^2$, B.F. Goodrich), was interposed between the melanophilic and surface melanophobic layers. The printing plates were imaged and used for printing as described in Example 1. TABLE II below shows the various plates and the printing results.

TABLE II

| PRINTING PLATE | % TBAF | Dmin | DENSITY AT 50% HALFTONE | DENSITY AT 80% HALFTONE | Dmax (100%) |
|---|---|---|---|---|---|
| Control C-2 | 0 | 0.04 | 0.06 | 0.08 | 1.4 |
| E-5 | 5 | 0.04 | 0.17 | 0.63 | 1.4 |
| E-6 | 10 | 0.05 | 0.32 | 0.88 | 1.4 |
| E-7 | 15 | 0.04 | 0.36 | 0.78 | 1.4 |
| E-8 | 20 | 0.04 | 0.28 | 1.00 | 1.3 |

The data in TABLE II indicate that the addition of the fluoride ion releasing compound and the barrier layer improve image tone scale and plate speed. Additionally, there was no effect on the ink repelling property of the non-image areas. Adhesion of the barrier layer to the other layers was excellent.

EXAMPLE 3

A Control C-3. printing plate was prepared as described in Example 1 wherein a polyethylene terephthalate support (100 $\mu$m) was coated with the nitrocellulose dispersion noted above to form a melanophilic layer (1.08 $g/m^2$ nitrocellulose and 0.65 $g/m^2$ carbon black), using a coating knife. The coating solvent was a blend of 54 weight % methyl ethyl ketone, 22% each of n-butyl acetate and acetone, and 2% isopropyl alcohol.

An outer surface melanophobic layer was coated to have a 1.61 $g/m^2$ of PS 448, a vinyldimethyl terminated poly (dimethylsiloxane) (United Chemical Technologies), 0.061 $g/m^2$ of PS 120 a poly(hydromethylsiloxane) (United Chemical Technologies), 0.021 $g/m^2$ of methyl pentynol (Aldrich ) and 0.011 $g/m^2$ of SIP 6831.1, a platinum-divinyltetramethyldisiloxane solution (Gelest, Inc.) from hexane.

A "barrier" layer composed of polystyrene (0.54 $g/m^2$) was interposed between the melanophilic and surface melanophobic layers There was no fluoride-releasing compound in this Control C-3 plate.

In the printing plate of this invention (E-9), the layers were the same as described for the Control C-3 plate with the addition that the melanophilic layer included fluoride-releasing Compound B (shown below) at 20 weight % of the nitrocellulose coverage. The amount of solvent was adjusted to keep the dried nitrocellulose coverage constant.

Both the Control C-3 and E-9 printing plates were imaged and used for printing as described in Example 1. Table III below shows the various printing plates and the printing results after 1000 sheets.

TABLE III

| PRINTING PLATE | % COMPOUND B | Dmin | DENSITY AT 50% HALFTONE | DENSITY AT 80% HALFTONE | Dmax (100%) |
|---|---|---|---|---|---|
| Control C-3 | 0 | 0.08 | 0.13 | 0.77 | 1.4 |
| E-9 | 20 | 0.08 | 0.39 | 1.1 | 1.7 |

Compound B:

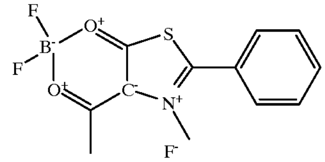

The invention has been described in detail with particular reference to preferred embodiments thereof, but it will be understood that variations and modifications can be effected within the spirit and scope of the invention.

We claim:

1. A method of imaging, the method comprising the step of imagewise ablating with infrared radiation a surface melanophobic layer of an imaging member to provide a surface image on the imaging member;

in which:

the surface melanophobic layer comprises a siloxane polymer comprising —Si—O— bonds;

the imaging member comprises:

the surface melanophobic layer;

a melanophilic layer comprising a polymeric matrix capable of accepting ink;

a photothermal conversion material; and a compound that, upon imaging, releases a moiety that facilitates breakdown of the —Si—O— bonds of the siloxane polymer; and the method does not comprise wet processing or mechanical cleaning to remove material ablated by the imagewise ablating step.

2. The method of claim 1 further comprising preheating the imaging member prior to the imagewise ablating step.

3. The method of claim 1, in which the moiety that facilitates degradation of the surface melanophobic layer is fluoride ion.

4. The method of claim 1 in which the moiety-releasing compound is located in the melanophilic layer.

5. The method of claim 4 in which the photothermal conversion material is carbon black or a broad band dye.

6. The method of claim 1 in which the moiety-releasing compound is encapsulated and the melanophilic layer is a support for the imaging member.

7. The method of claim 1 in which the moiety-releasing compound is encapsulated and located in the surface melanophobic layer.

8. The method of claim 1 further comprising a support having the melanophilic layer and the surface melanophobic layer disposed thereon.

9. The method of claim 1 further comprising a barrier layer between the melanophilic layer and the surface melanophobic layer.

10. The method of claim 9 in which the barrier layer comprises a polyurethane.

11. The method of claim 9 in which the moiety-releasing compound is located in the melanophilic layer.

12. The method of claim 1 in which the surface melanophobic layer comprises the photothermal conversion material.

13. The method of claim 1 in which the melanophilic layer comprises nitrocellulose and the photothermal conversion material.

14. The method of claim 1, in which the melanophilic layer comprises a polyacrylate.

15. The method of claim 1 in which the melanophilic layer comprises said photothermal conversion material.

16. The method of claim 1 in which the moiety-releasing compound is a tetraalkyl ammonium fluoride.

17. A method of printing comprising imagewise ablating with infrared radiation a surface melanophobic layer of an imaging member to provide a surface image on the imaging member; and applying a lithographic ink to the surface image and imagewise transferring the ink to a receiving material;

in which:

the surface melanophobic layer comprises a siloxane polymer comprising —Si—O— bonds;

the imaging member comprises:

the surface melanophobic layer;

a melanophilic layer comprising a polymeric matrix capable of accepting ink;

a photothermal conversion material; and a compound that, upon imaging, releases a moiety that facilitates breakdown of the —Si—O— bonds of the siloxane polymer; and the method does not comprise wet processing or mechanical cleaning to remove material ablated by the imagewise ablating step.

18. The method of claim 17 in which the moiety that facilitates degradation of the surface melanophobic layer is fluoride ion.

19. The method of claim 17 in which the moiety-releasing compound is located in the melanophilic layer.

20. The method of claim 19 in which the photothermal conversion material is carbon black or a broad band dye.

21. The method of claim 17 in which the moiety-releasing compound is encapsulated and the melanophilic layer is a support for the imaging member.

22. The method of claim 17 in which the moiety-releasing compound is encapsulated and located in the surface melanophobic layer.

23. The method of claim 17 further comprising a support having the melanophilic layer and the surface melanophobic layer disposed thereon.

24. The method of claim 17 further comprising a barrier layer between the melanophilic layer and the surface melanophobic layer.

25. The method of claim 24 in which the barrier layer comprises a polyurethane.

26. The method of claim 24 in which the moiety-releasing compound is located in the melanophilic layer.

27. The method of claim 17 in which the surface melanophobic layer comprises the photothermal conversion material.

28. The method of claim 17 in which the melanophilic layer comprises nitrocellulose and the photothermal conversion material.

29. The method of claim 17 in which the melanophilic layer comprises a polyacrylate.

30. The method of claim 17 in which the melanophilic layer comprises said photothermal conversion material.

31. The method of claim 17 in which the moiety-releasing compound is a tetraalkyl ammonium fluoride.

32. The method of claim 17 further comprising preheating the imaging member prior to the imagewise ablating step.

* * * * *